United States Patent [19]
Ichikawa

[11] Patent Number: 5,592,094
[45] Date of Patent: Jan. 7, 1997

[54] BATTEREY DISCHARGE CHARACTERISTICS CALCULATION METHOD AND REMAINING BATTERY CAPACITY MEASURING DEVICE

[75] Inventor: Hiroshi Ichikawa, Shizuoka-ken, Japan

[73] Assignee: Yazaki Corporation, Tokyo, Japan

[21] Appl. No.: 562,608

[22] Filed: Nov. 24, 1995

[30] Foreign Application Priority Data

Nov. 25, 1994 [JP] Japan .................................. 6-291131

[51] Int. Cl.$^6$ .................................................. G01N 27/416
[52] U.S. Cl. .......................... 324/427; 324/431; 340/636; 320/48; 364/481
[58] Field of Search .................................. 324/426, 427, 324/428, 429, 431, 433; 364/481, 483, 550; 320/43, 48, 22; 340/636

[56] References Cited

U.S. PATENT DOCUMENTS

| | | | |
|---|---|---|---|
| 4,949,046 | 8/1990 | Seyfang | 324/427 |
| 5,321,627 | 6/1994 | Reher | 364/483 |
| 5,404,106 | 4/1995 | Matsuda | 324/431 |
| 5,539,318 | 7/1996 | Sasaki | 324/428 |
| 5,541,489 | 7/1996 | Dunstan | 320/48 X |
| 5,541,490 | 7/1996 | Sengupta et al. | 320/22 X |

FOREIGN PATENT DOCUMENTS 4-115084  10/1992  Japan .

*Primary Examiner*—Kenneth A. Wieder
*Assistant Examiner*—Diep Do
*Attorney, Agent, or Firm*—Finnegan, Henderson, Farabow, Garrett & Dunner, L.L.P.

[57] ABSTRACT

A method and a device for determining the battery discharge characteristics and estimating the remaining battery capacity easily by a simple mechanism even if time elapses. A discharge characteristics calculation section reads voltage, current, and temperature from a voltage sensor, a current sensor, and a temperature sensor, respectively, and determines the approximated discharge characteristics at a given time based on a position relationship of the discharge characteristics curved surface function $V = a \cdot \log(H_0 - H) + b \cdot H + c$ to voltage-temperature-duration of discharge axes. A duration of discharge characteristics calculation section determines the duration of discharge from a fully charged state to the present based on the approximated discharge characteristics. A remaining capacity calculation section determines the remaining capacity based on the approximated discharge characteristics.

7 Claims, 5 Drawing Sheets

BATTEREY DISCHARGE CHARACTERISTICS CALCULATION METHOD AND REMAINING BATTERY CAPACITY MEASURING DEVICE

BACKGROUND OF THE INVENTION

1. Field of the Invention

The present invention relates to a battery discharge characteristics calculation method and a remaining battery capacity measuring device, and more specifically, to a battery discharge characteristics calculation method with which the discharge characteristics can be determined only through sampling voltage, current, and temperature, and a remaining battery capacity measuring device capable of easily determining a remaining battery capacity by using the current discharge characteristics rather than using a table having two or more discharge characteristics.

2. Description of the Related Art

In general, it would be the best possible to determine the remaining capacity of a battery as the result of subtraction of a discharge amount obtained out of a load current and a terminal voltage from the fully charged amount. However, in general, batteries have discharge characteristics which are different depending upon the variation of load connected thereto, an ambient temperature, aged deterioration and the like. Therefore, the remaining capacity of batteries is different depending upon variation of a load, an ambient temperature, aged deterioration and the like.

For example, as shown in FIG. 1, even if the temperature is kept at a constant value of 20° C., batteries have different discharge characteristics depending upon whether the current discharged from the battery is 10 A, 20 A, ... or 80 A. When it is assumed that a usable voltage range is from 25 V to 20 V, the battery becomes unusable when it is operated for 160 minutes with a discharge current of 10 A and when it is operated for 40 minutes with a discharge current of 30 A. That is, batteries have a different discharge ratio and thus a different remaining capacity depending upon variation of the load.

In particular, since electric cars are powered by batteries, the remaining capacity of the battery must be accurately predicted. The following voltage and current detecting method is generally available to measure the remaining capacity of a battery.

This voltage and current detecting method uses a characteristics curve whose parameter is an index SOC (State of Charge) indicating the remaining battery capacity of each discharge characteristic from relationship between a load current and a terminal voltage of a battery shown in FIG. 1, and determines SOC from the measured voltage and current values by using these two or more characteristic curves. This method, however, requires the use of a database for storing data of a plurality of characteristic curves. For example, the device disclosed in Japanese Utility Model Registration Laid-open No. 4-115084 conducts the following operations.

FIG. 2 is a block diagram schematically showing a conventional remaining battery capacity meter for electric cars. As shown in FIG. 2, a voltage sensor, a current sensor, and a temperature sensor measure the terminal voltage of a battery for electric cars, a load current flowing through the battery, and the liquid temperature, respectively. These sensors produce signals indicative of the measured values. Subsequently, a signal amplifier amplifies the signals, an analog filter removes noise from the amplified signal, and an A/D converter converts the signal while the electric car is in operation.

Subsequently, moving average filters 2-1 to 2-3 are digital exchange filters for the smoothing operation. The remaining capacity calculation and processing unit 3 calculates the remaining capacity of the battery at a normal temperature of 30° C. by using the temperature correction and I-V tables, and an interpolation formula. From the value of the remaining capacity, an average processing unit 4, a moving average processing unit 5, and an average processing unit 6 calculate the remaining capacity at the present liquid temperature again according to the conversion formula. The calculation result is smoothed again and then produced every 10 minutes on an LED display unit 7 as a graph and a value, indicating the remaining capacity of the battery.

Further, a velocity pulse counter 8 counts velocity pulses to determine a travel distance, and a travel distance calculation unit 9 receives a signal indicative of the remaining capacity from the average processing unit 6 to determine the distance to be further traveled from the determined travel distance and remaining capacity.

However, the voltage and current can abruptly change in accordance with a variation of the load. For example, in the case of electric cars, the remaining capacity of the battery is determined by means of summing regenerative currents generated when the electric car reduces speed. However, in the case of electric cars, the voltage and current abruptly change in accordance with a variation of the load.

Thus, unless the voltage, current, and their pick-up time are determined with high accuracy, the discharge characteristics cannot be accurately determined. This causes the problem of a complicated operation due to the needed of additional steps such as correcting to increase the accuracy.

Also, it would be the best possible to determine the remaining capacity of the battery as the result of subtraction of the discharge amount obtained out of the load current and terminal voltage from the fully charged amount, on the assumption that an electric car starts running from a fully charged state. In practice, however, the electric car may start not being fully charged. Even if it is fully charged, the electric car may have sat unused for a length of time.

More specifically, the discharge duration from a fully charged state to the current cannot be predicted. This means that calculating the remaining capacity from the fully charged amount can only be achieved with various discharge characteristics estimated out of a duration of discharge, temperature, and a detected voltage. Accordingly, the discharge characteristics for various cases should be stored previously in, for example, a database for the calculation, which brings with it problems of the need for increased memory capacity and more complicated operations.

Further, the device disclosed in Japanese Utility Model Registration Laid-open No. 4-115084 uses a method of picking up voltage, current, and temperature to estimate the remaining capacity. However, this method relies on the calculation of the remaining capacity of the battery at a normal temperature of 30° C. by using the temperature correction and I-V tables, and an interpolation formula at the processing unit for estimating the remaining capacity at the current liquid temperature again according to the conversion formula. Thus, there exists a problem that an operation to determine the remaining capacity is complicated and the memory requirements and capacities are large.

SUMMARY OF THE INVENTION

The present invention was made to overcome the above mentioned problems and is directed to provide a method and a device capable of easily determining the discharge characteristics of a battery and estimating the remaining capacity thereof by a simple mechanism even if time elapses.

According to the present invention, there is provided a battery discharge characteristics calculation method achieved by using a sensing unit formed of a voltage sensor for use in detecting the terminal voltage of the battery connected to a load, a current sensor for use in detecting a current flowing through the load, and a temperature sensor for use in detecting the temperature of the battery to determine approximated discharge characteristics of the battery based on the detected voltage, current and temperature, comprising the steps of: reading signals supplied from the sensing unit, the signals being indicative of the voltage, current, and temperature of the battery to be varied depending upon the variation of the load; and approximating the discharge characteristics in accordance with the variation of the load at a curved surface function formed on voltage, temperature, and duration of discharge axes, and substituting the detected current and temperature for the corresponding coefficients of the curved surface function to determine the approximated discharge characteristics at that given temperature on the voltage-duration of discharge axes.

According to another aspect of the present invention, there is provided a remaining battery capacity measuring device comprising: a sensing unit formed of a voltage sensor for use in detecting the terminal voltage of the battery connected to a load, a current sensor for use in detecting a current flowing through the load, and a temperature sensor for use in detecting the temperature of the battery; discharge characteristics calculation means for use in approximating the discharge characteristics to be varied depending upon the variation of the load, at a curved surface function formed on voltage, temperature, and duration of discharge axes, and for use in substituting the detected current and temperature for the corresponding coefficients of the curved surface function to determine the approximated discharge characteristics at that given temperature on the voltage-duration of discharge axes; discharge characteristics calculation means for use in determining the duration of discharge from a fully charged state to the present based on the approximated discharge characteristics; and remaining capacity calculation means for use in determining the remaining capacity of the battery when the voltage is detected, from the area based on the duration of discharge from beginning to end of the approximated discharge characteristics and the area of based on the duration of discharge.

In a preferred embodiment, the curved surface function is:

$$V = a \cdot \log(H_0 - H) + b \cdot H + c$$

wherein,

V is the voltage;

a is a curvilinear changing coefficient function on voltage, temperature, and duration of discharge axes;

$H_0$ is a full duration function of discharge on the temperature, discharge current, voltage axes in accordance with different types of batteries;

H is the duration of discharge in accordance with detected temperature and discharge current;

b is a correction coefficient function of the duration of discharge H changing according to temperature and duration of discharge; and c is a correction coefficient function of initial voltage changing according to the temperature and the duration of discharge.

In another preferred embodiment, the remaining capacity calculation means regards a ratio of the area based on the duration of discharge and the area based on the duration of discharge from beginning to end of the approximated discharge characteristics as the remaining capacity.

In still another preferred embodiment, the remaining capacity calculation means regards the area based on the duration of discharge from beginning to end of the approximated discharge characteristics itself as the remaining capacity.

In a further preferred embodiment, display means for use in displaying said remaining capacity acquired by said remaining capacity calculation means is equipped.

With the battery discharge characteristics calculation method according to the present invention, the voltage, the current, and the temperature are detected in accordance with the variation of the load by the voltage sensor, the current sensor, and the temperature sensor, respectively. The detected values of the voltage, current and temperature are substituted into the corresponding coefficients of the curved surface function to determine the approximating discharge characteristics at the current voltage, temperature, and duration of discharge axes. This permits to provide an approximated discharge characteristics on the voltage-duration of discharge axes at a given temperature.

In the remaining battery capacity measuring device according to the present invention, the voltage, the current, and the temperature are detected by the voltage sensor, the current sensor, and the temperature sensor, respectively, depending on the variation of the load.

The battery discharge characteristics calculation section substitutes the detected voltage, current and temperature for the corresponding coefficients of the curved surface function to determine the approximated discharge characteristics at the temperature on the voltage-discharge axes and the duration of discharge in accordance with the detected voltage value as the duration of discharge from a fully charged state to the present based on the approximated discharge characteristics. The remaining battery capacity measuring device determines the remaining capacity from an area based on the duration of discharge from beginning to end predetermined according to the types of batteries and the area based on the determined duration of discharge.

The battery discharge characteristics calculation section stores the curved surface function as $V = a \cdot \log(H_0 - H) + b \cdot H + c$, substitutes the sampled temperature, current, and voltage values for the corresponding coefficients of the function to determine the approximated discharge characteristics at the temperature by the curved surface function and the duration of discharge easily.

The nature, principle and utility of the invention will become more apparent from the following detailed description when read in conjunction with the accompanying drawings.

DETAILED DESCRIPTION OF THE PREFERRED EMBODIMENT

Figure 1:
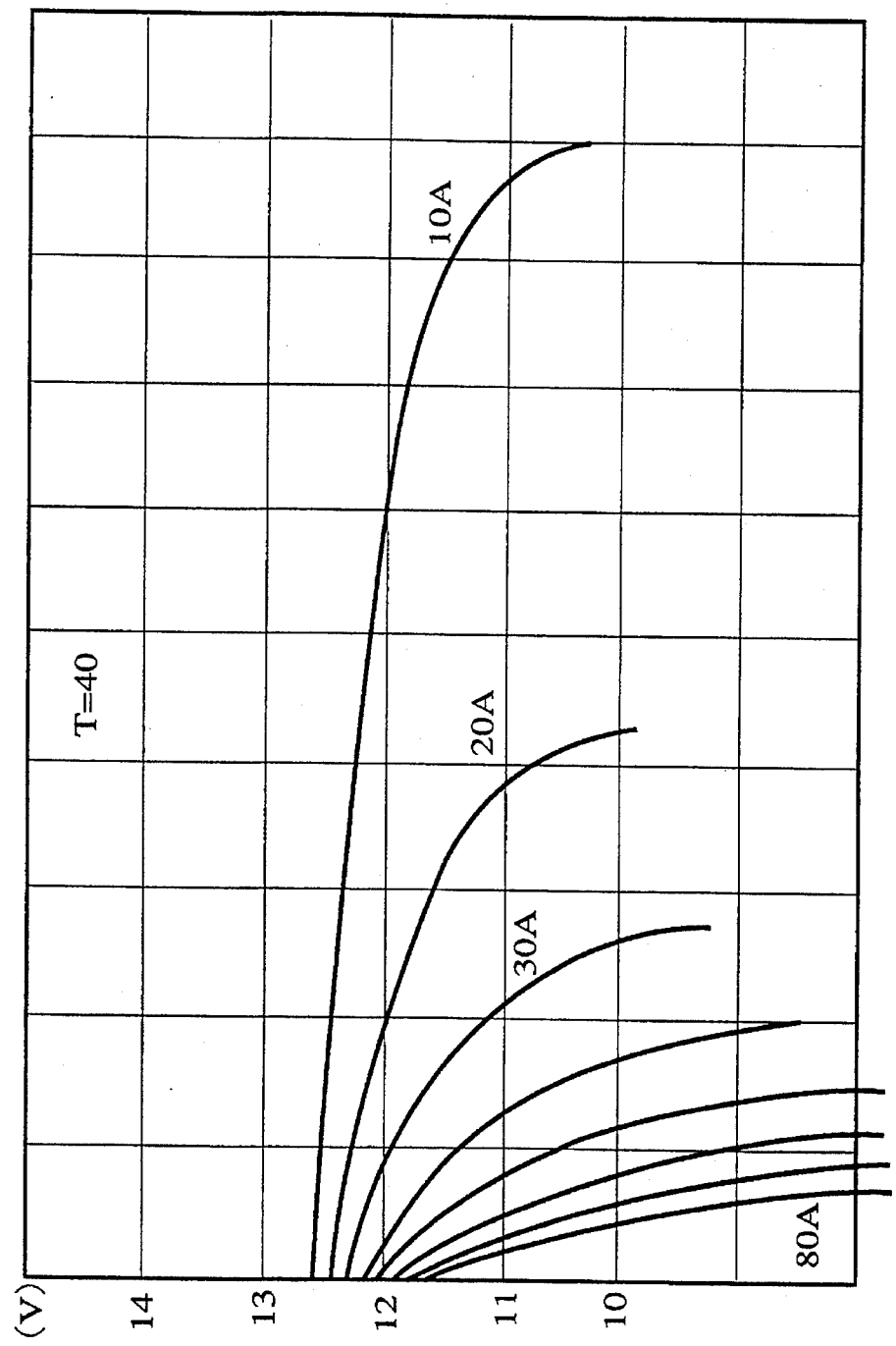
FIG. 1 is a graph illustrating discharge characteristics of a battery.
Figure 2:
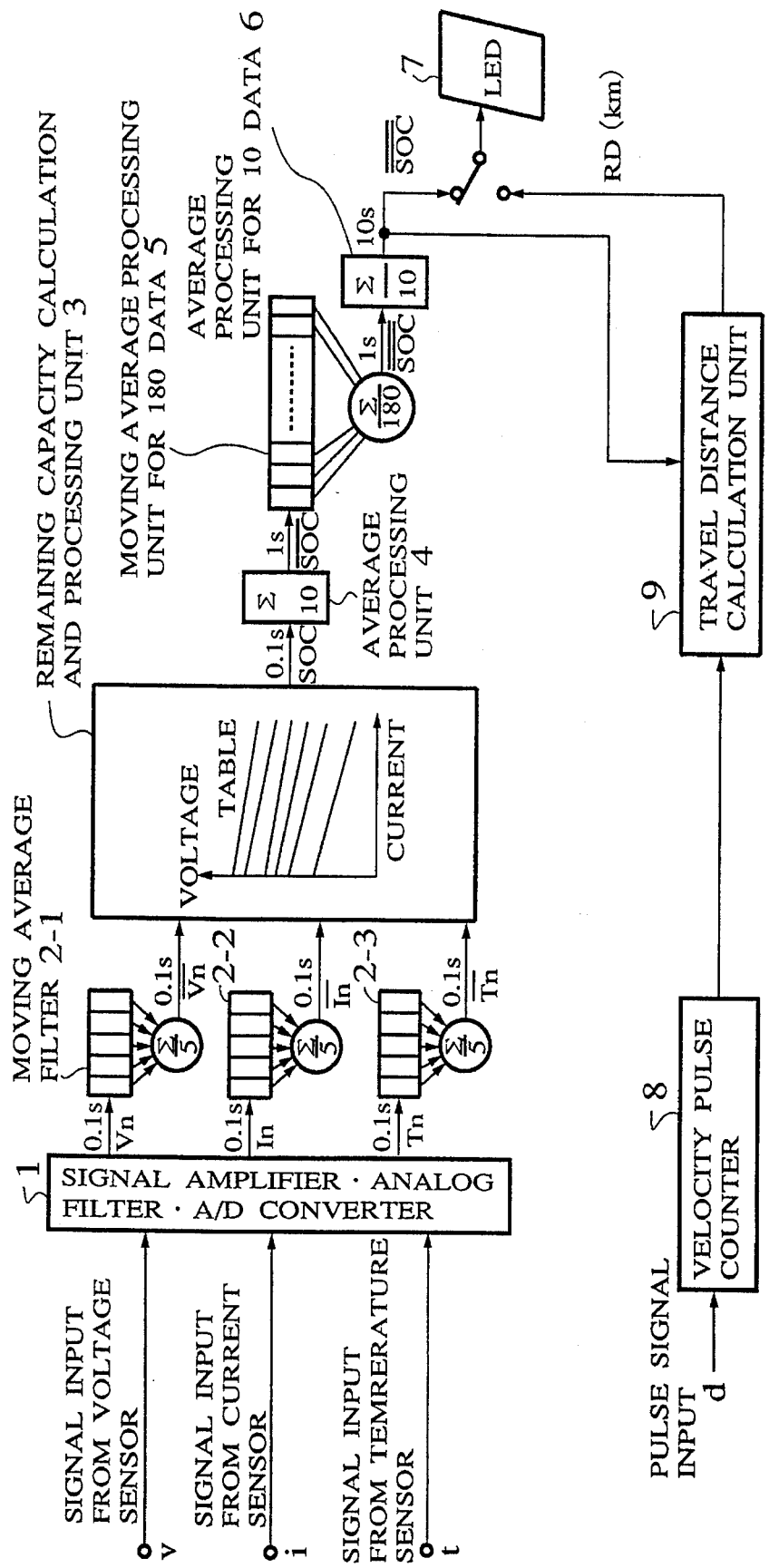
FIG. 2 is a block diagram schematically showing the arrangement of a conventional remaining battery capacity meter for electric cars.
Figure 3:
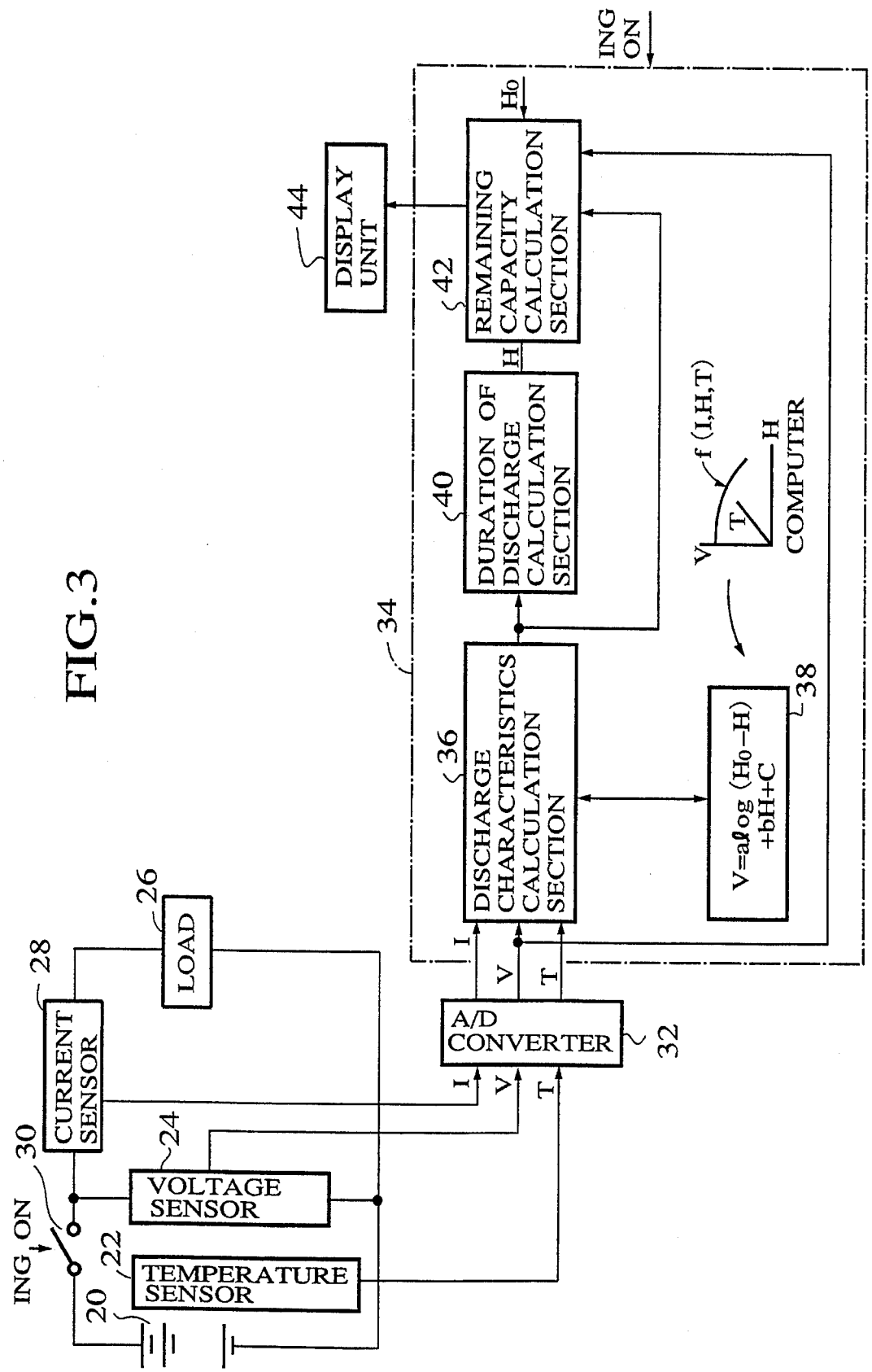
FIG. 3 is a block diagram schematically showing the arrangement of a preferred embodiment.

FIG. 3 is a block diagram schematically showing the arrangement of an embodiment. In FIG. 3, reference numeral 20 denotes a battery. Reference numeral 22 denotes a temperature sensor for use in detecting the temperature of the battery 20. Reference numeral 24 denotes a voltage sensor for use in detecting the voltage of the battery 20. Reference numeral 28 denotes a current sensor for use in detecting the discharge current flowing through a load 26. Reference numeral 30 denotes a switch acting as an ignition key is inserted.

Reference numeral 32 denotes an A/D converter for use in detecting, according to a sampling cycle, the temperature, the voltage, and the current from the temperature sensor 22, the voltage sensor 24, and the current sensor, respectively, and converting these values into digital signals for the outputs.

Reference numeral 34 denotes a computer. The computer 34 has at least the following program, and directs to detect voltage, current, and temperature as the ignition key is inserted.

Reference numeral 36 denotes a discharge characteristics calculation section, which reads the voltage, the current, and the temperature from the A/D converter 32, and substitutes them for the corresponding coefficients of the curved surface function at the current voltage, temperature, and duration of discharge axes previously stored in a memory 38 which will be described later, to determine an approximated discharge characteristics on the voltage-duration of discharge axes.

The discharge characteristics calculation section 36 also corrects a full-duration of discharge and an initial value according to the types of the battery 20 based on a predetermined correction coefficient function.

Reference numeral 40 denotes a duration of discharge calculation section, which calculates a duration of discharge in accordance with the voltage value as a duration of discharge from fully charged to the present based on the approximated discharge characteristics determined by the discharge characteristics calculation section 36.

Reference numeral 42 denotes a remaining capacity calculation section, which determines an area during the full-duration of discharge predetermined according to the types of the battery 20 based on the approximated discharge characteristics, and an area till the duration of discharge determined by the approximated discharge characteristics. It also determines the ratio of the both areas as a remaining capacity.

Figure 4A:
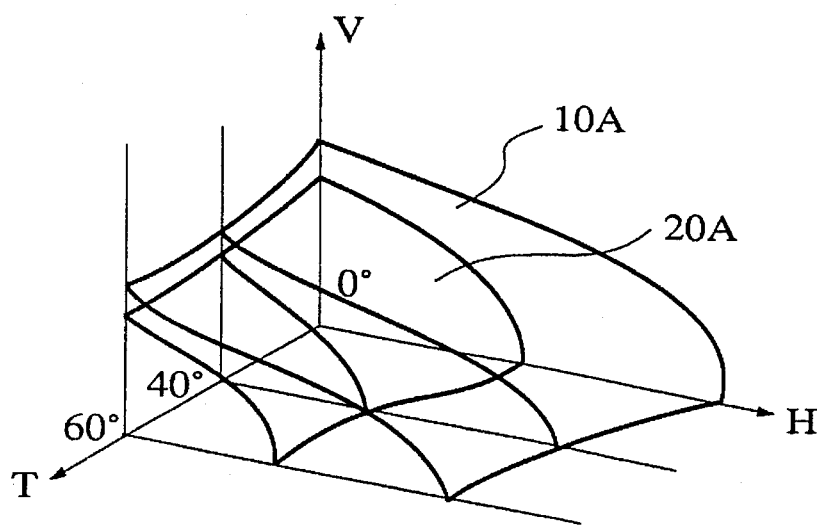
FIGS. 4A and 4B are graphs for use in describing an operation of the embodiment.
Figure 4B:
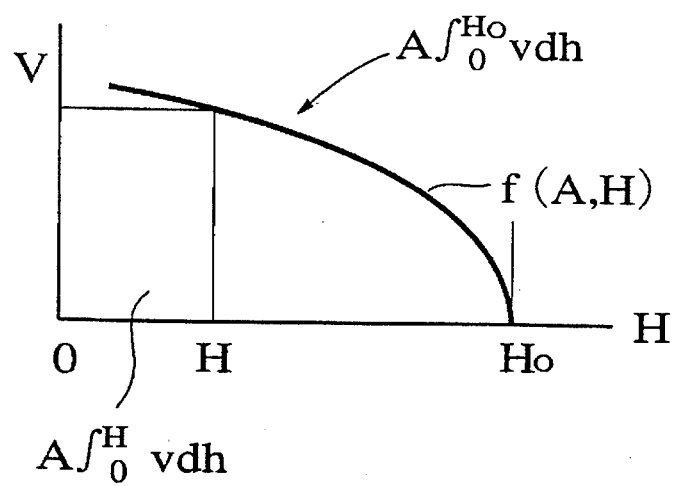

The following is an explanation about a remaining capacity measuring device so structured. FIGS. 4A and 4B are a graph for use in describing the operation of the embodiment. For example, when the ignition key is turned on and the electric car starts operation, the temperature, the voltage, and the current from the temperature sensor 22, the voltage sensor 24, and the current sensor 28, respectively, are sampled by the A/D converter 32. The discharge characteristics calculation section 36 in the computer 34 determines an approximated discharge characteristics.

In this approximated discharge characteristics, the characteristics varies according to the temperature T, the hour H, and the current A when in general the voltage is a characteristics value. For example, as shown in FIG. 4A, the voltage is plotted on the three-dimensional space defined by the voltage, temperature, and time axes. For example, it is assumed that the temperature range is from 0° to 60° C., the curved surfaces of the discharge characteristics at 10A and 20A are exhibited when the currents are 10A and 20A, as shown in FIG. 4A.

As shown FIG. 4A, as the voltage, the temperature, and the hour change, each discharge characteristics changes.

That is, when these curved surfaces are represented by a curved surface function f(I, H, T), if a curvilinear changing coefficient a is determined, an approximating discharge characteristics can be determined at this time from each sampled value, as shown in FIG. 4B.

The present invention determined these curved surface functions by experiments statistically, and stored them as the following formula in a memory 38. The curved surface function f(I, H, T)=V $$= a \cdot \log (H_0 - H) + b \cdot H + c \qquad (1),$$

wherein

V: voltage;

a: curvilinear changing coefficient function a(I, H, T) on voltage, temperature, duration of discharge axes;

$H_0$: full-duration function of discharge on temperature, discharge current, voltage-axes in accordance with different types of batteries, $H_0$(I, H, T);

H: duration of discharge in accordance with temperature and discharge current;

b: correction coefficient function of duration of discharge H changing according to temperature and duration of discharge, b(I, H, T); and c: correction coefficient function of initial voltage changing according to temperature and duration of discharge, c(I, H, T).

As shown above, these coefficients are the functions for the discharge current, and the temperature.

Then the discharge characteristics calculation section 36 substitutes each value of temperature T, hour H, and current I sampled for each coefficient function to determine each coefficients on each voltage-duration of discharge axes, and determines the approximated discharge characteristics by the above curved surface function f(I, H, T).

The duration of discharge calculation section 40 transforms the above curved surface function f(I, H, T) and determines the duration of discharge till the present.

That is, so far, the duration of discharge from the fully charged state to the present could not be predicted, but according to the present invention, the duration of discharge H easily by the above curved surface function f(I, H, T) can be determined, and FIG. 4B shows that the duration of discharge H is determined on an intersecting point of the sampled voltage V and the approximated discharge characteristics f(V, H).

The remaining capacity calculation section 42 determines the index SOC (State of Charge) indicating the remaining battery capacity by means of applying the voltage V, the duration of discharge H, and the full charge duration to the following formula, and have the display unit 44 display this value.

$$SOC = \left(1 - \frac{A \int_0^H V dh}{A \int_0^{H_o} V dh}\right) \times 100 \quad (2)$$

wherein, A is the discharge current.

Figure 5:
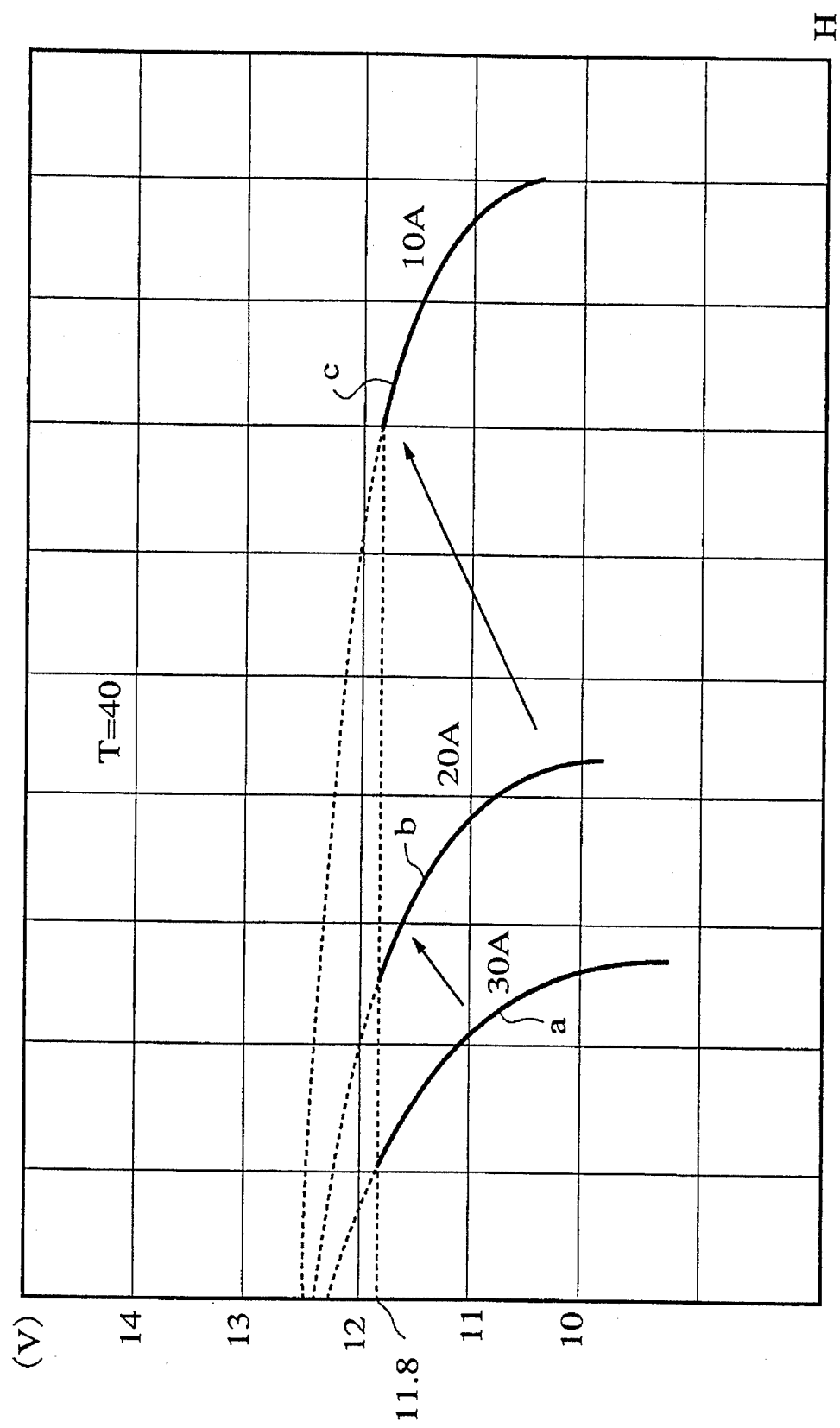
FIG. 5 is a graph for use in describing a tendency of the embodiment at a temperature of 40° C.

More specifically, according to the present invention, the voltage, the current, and the temperature are picked up, and the approximated discharge characteristics f(V, H) representing each discharge characteristics f(V, H) is determined as shown in FIG. 4. For example, when it is assumed that the temperature is kept at a constant value of 40° C., the approximated discharge characteristics on the voltage-duration of discharge axes by the above curved surface function f(I, H, T) is automatically determined a in FIG. 5 when a sampled voltage is 11.8 V and a current is 30 A, b in FIG. 5 when 20 A, c in FIG. 5 when 10 A. That is, without storing the discharge characteristics, the discharge characteristics can be determined in accordance with the present voltage, current, and temperature.

According to the present invention, an area during the full-duration of discharge $H_0$ is determined based on the discharge characteristics f(V, H) and an area till a duration of discharge H based on the approximated discharge characteristics is determined. The ratio of the both areas are determined as the remaining capacity.

The duration of discharge H changes according to different types of batteries. Therefore according to the present invention, also, the approximated discharge characteristics is employed to correct the duration of discharge and accurately determine the remaining capacity even if the battery types change.

Further, the duration of discharge $H_0$ and an initial value which is an value during fully charged vary according to systems. Therefore the approximated discharge characteristics is employed to accurately determine the remaining capacity by setting up a constant C, which corrects a full-duration of discharge and the initial value.

The conventional device must operate by storing two or more cases in accordance with the duration of discharge, the temperature, and the detected voltage in a database when determining the remaining capacity. On the other hand, according to the present invention, the discharge characteristics is determined by the equation (1) and then the remaining capacity is determined by the equation (2) without storing two or more cases in accordance with the duration of discharge, the temperature, and the detected voltage in the database, whereby operating easily and decreasing the memory capacity, at the same time, calculating rapidly.

In the above embodiment, the device is explained as the remaining capacity measuring devise for electric cars, but the device can be applied to a portable personal computer and the like.

Also, in the above embodiment, it is explained that the remaining capacity is determined by the area ratio, but the value according to the rest of the area can be the remaining capacity.

As described above, according the present invention, the voltage, the current, and the temperature are read and substituted for the corresponding coefficients of the curved surface function formed on the voltage, temperature, and duration of discharge axes determined as the approximated discharge characteristics in accordance with the variation of the load to determine the approximated discharge characteristics at the temperature on the voltage-duration of discharge axes. Therefore since without storing two or more discharge characteristics in a table, only sampling a voltage, a current, and a temperature, an approximating discharge characteristics at the temperature, current, voltage is acquired, the memory capacity can be decreased.

Further, according to the present invention, the duration of discharge from the fully charged state to the present is acquired based on the above approximated discharge characteristics, and the remaining capacity at the time when a voltage is read is determined by the ratio of the area based on the above duration of discharge and the area based on the full-duration of discharge.

Also, the curved surface function is stored as $V = a \cdot \log(H_0 - H) + b \cdot H + c$, and with the sampled temperature, current, voltage substituted, the approximated discharge characteristics at the temperature on the voltage-duration of discharge-axes is easily acquired, whereby easily determining the duration of discharge H. Therefore, even if a electric car runs after sitting unused for a length of time, since the duration of discharge from fully charged to the present can be easily determined, the remaining capacity can be accurately determined.

It should be understood that many modifications and adaptations of the invention will become apparent to those skilled in the art and it is intended to encompass such obvious modifications and changes in the scope of the claims appended hereto.

What is claimed is:

1. A battery discharge characteristics calculation method achieved by using a sensing unit formed of a voltage sensor for use in detecting the terminal voltage of the battery connected to a load, a current sensor for use in detecting a current flowing through the load, and a temperature sensor for use in detecting the temperature of the battery to determine approximated discharge characteristics of the battery based on the detected voltage, current and temperature, comprising the steps of:

reading signals supplied from the sensing unit, the signals being indicative of the voltage, current, and temperature of the battery to be varied depending upon the variation of the load; and approximating the discharge characteristics in accordance with the variation of the load at a curved surface function formed on voltage, temperature, and duration of discharge axes, and substituting the detected current and temperature for the corresponding coefficients of the curved surface function to determine the approximated discharge characteristics at that given temperature on the voltage-duration of discharge axes.

2. A battery discharge characteristics calculation method according to claim 1, wherein:

said curved surface function is;

$$V = a \cdot \log(H_0 - H) + b \cdot H + c$$

wherein,

V is the voltage;

a is a curvilinear changing coefficient function on voltage, temperature, and duration of discharge axes;

$H_0$ is a full duration function of discharge on the temperature, discharge current, voltage axes in accordance with different types of batteries;

H is the duration of discharge in accordance with detected temperature and discharge current;

b is a correction coefficient function of the duration of discharge H changing according to temperature and duration of discharge; and c is a correction coefficient function of initial voltage changing according to the temperature and the duration of discharge.

3. A remaining battery capacity measuring device comprising:

a sensing unit formed of a voltage sensor for use in detecting the terminal voltage of the battery connected to a load, a current sensor for use in detecting a current flowing through the load, and a temperature sensor for use in detecting the temperature of the battery;

discharge characteristics calculation means for use in approximating the discharge characteristics to be varied depending upon the variation of the load, at a curved surface function formed on voltage, temperature, and duration of discharge axes, and for use in substituting the detected current and temperature for the corresponding coefficients of the curved surface function to determine the approximated discharge characteristics at that given temperature on the voltage-duration of discharge axes;

discharge characteristics calculation means for use in determining the duration of discharge from a fully charged state to the present based on the approximated discharge characteristics; and remaining capacity calculation means for use in determining the remaining capacity of the battery when the voltage is detected, from the area based on the duration of discharge from beginning to end of the approximated discharge characteristics and the area of based on the duration of discharge.

4. A remaining battery capacity measuring device according to claim 3, wherein:

said curved surface function is;

$$V = a \cdot \log(H_0 - H) + b \cdot H + c$$

wherein,

V is the voltage;

a is a curvilinear changing coefficient function on voltage, temperature, and duration of discharge axes;

$H_0$ is a full duration function of discharge on the temperature, discharge current, voltage axes in accordance with different types of batteries;

H is the duration of discharge in accordance with detected temperature and discharge current;

b is a correction coefficient function of the duration of discharge H changing according to temperature and duration of discharge; and c is a correction coefficient function of initial voltage changing according to the temperature and the duration of discharge.

5. A remaining battery capacity measuring device according to claim 3, wherein:

said remaining capacity calculation means regards a ratio of the area based on said duration of discharge and the area based on the duration of discharge from beginning to end of the approximated discharge characteristics as said remaining capacity.

6. A remaining battery capacity measuring device according to claim 3, wherein:

said remaining capacity calculation means regards the area based on the duration of discharge from beginning to end of the approximated discharge characteristics itself as said remaining capacity.

7. A remaining battery capacity measuring device according to claim 3, further comprising:

display means for use in displaying said remaining capacity acquired by said remaining capacity calculation means.

\* \* \* \* \*